United States Patent [19]

Masaki et al.

[11] Patent Number: 4,912,680
[45] Date of Patent: Mar. 27, 1990

[54] IMAGE MEMORY HAVING PLURAL INPUT REGISTERS AND OUTPUT REGISTERS TO PROVIDE RANDOM AND SERIAL ACCESSES

[75] Inventors: Yasuo Masaki; Kimitoshi Hori, both of Osaka, Japan

[73] Assignee: Minolta Camera Kabushiki Kaisha, Azuchi, Japan

[21] Appl. No.: 239,749

[22] Filed: Sep. 2, 1988

[30] Foreign Application Priority Data

Sep. 3, 1987 [JP] Japan .................. 62-221693
Sep. 3, 1987 [JP] Japan .................. 62-221694

[51] Int. Cl.[4] .................. G11C 7/00; G11C 11/40; G11C 13/00
[52] U.S. Cl. .................. 365/230.09; 365/189.12; 365/189.04; 365/78; 365/221
[58] Field of Search ............. 365/238, 189.12, 189.05, 365/189.04, 230.09, 221, 78

[56] References Cited

U.S. PATENT DOCUMENTS 4,639,864  1/1987  Ishii .................. 365/230.09
4,796,231  1/1989  Pinkham .................. 365/189.05
4,802,133  1/1989  Kanuma et al. .................. 365/189.12

OTHER PUBLICATIONS

National Panasonic, "Digital Integrated Circuits Data", MN4700, Apr. 1987.

Primary Examiner—Stuart N. Hecker
Assistant Examiner—Alfonso Garcia
Attorney, Agent, or Firm—Burns, Doane, Swecker & Mathis

[57] ABSTRACT

A plurality of registers for writing are connected to data input portions of respective memory devices and a plurality of registers for reading are connected to the data output portions thereof. A random access bus and a serial access bus are respectively connected to both of the registers for writing and the registers for reading. A control circuit controls the memory devices, registers for writing and the registers for reading to effect serial input/output control and random access control.

6 Claims, 12 Drawing Sheets

IMAGE MEMORY HAVING PLURAL INPUT REGISTERS AND OUTPUT REGISTERS TO PROVIDE RANDOM AND SERIAL ACCESSES

BACKGROUND OF THE INVENTION

1. Field of the Invention

The present invention relates to an image memory and, more specifically, to an image memory particularly suitable for an image processing apparatus.

2. Description of Related Art

Figure 1A:
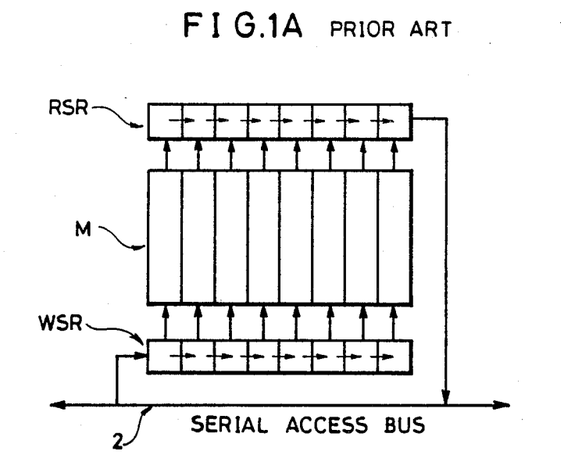
FIG. 1A is a block diagram showing a schematic structure of a conventional field image memory IC.

FIG. 1A shows a schematic structure of a conventional field image memory IC (for example, MN4700 produced by Matsushita Electronics Corporation). The memory IC comprises a shift register WSR for writing and a shift register RSR for reading capable of high speed operation provided separately on a data input portion and on a data output portion of a memory device M. In serial writing operation, data from a serial access bus 2 is held in a register in the first stage of the shift register WSR for writing, and when the next data is inputted, the data which has been held is shifted to the neighboring register. The operation is successively repeated until data for 8 pixels are stored in the shift register WSR for writing, then the data for 8 pixels are simultaneously written in the memory device M. The serial reading operation is the reversal of this operation, in which the data for 8 pixels are simultaneously read out from the memory device M to the shift register RSR for reading, and data for each pixel is successively shifted to be serially outputted to the serial access bus 2.

Figure 2A:
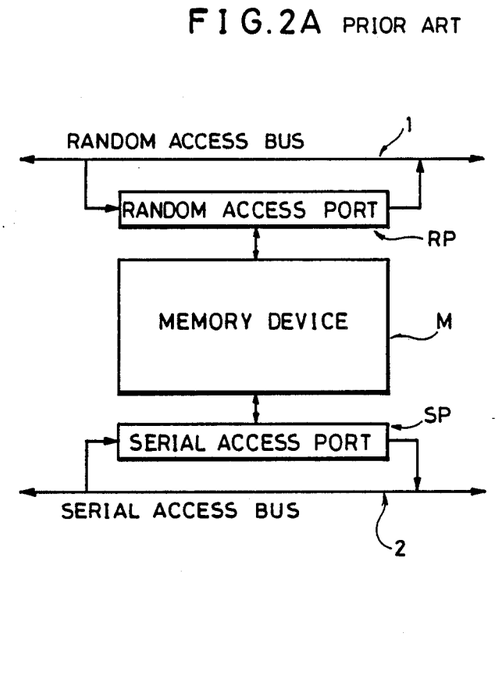
FIG. 2A is a block diagram showing a schematic structure of a conventional dual port memory.

A dual port memory has been known which has both a random access port RP and a serial access port SP as shown in FIG. 2A (for example, μPD41264C, produced by NEC Corporation). In the dual port memory, a random access port RP is connected to a random access bus 1 enabling random access to the memory device M. However, since only one shift register is provided to the serial access port SP connected to the serial access bus 2, the reading operation cannot be carried out simultaneously with the writing operation.

A conventional image memory has been developed for recording still images, and therefore sequential input/output function of the data was given priority. Meanwhile, in an image memory employed for an image processing apparatus, various processes should be carried out, such as geometrical conversion of images, generation of a figure in the memory device, an so on. However, these processing cannot be sequentially carried out, and therefore the random access function is essential in order to enable access to an arbitrary pixel in the image memory. In the image memory for the image processing apparatus, high speed transfer of image data is necessary for real time processing, so that the serial input/output must be done at high speed. The function of simultaneously inputting/outputting image data is necessary for effective use of the image memory.

In order to carry out interactive image processing such as superimposing of an image on a displayed image, reading of pixel value at a prescribed position, the serial reading function and the random access function must be simultaneously used.

Although a commercially available field image memory IC has high speed serial input/output function, the reading and writing of images can be carried out only by the block unit and lacks random access function. Accordingly, it is not suitable for an image memory of an image processing apparatus requiring access of pixel unit. Meanwhile, although the dual port memory is capable of random access, it has only one shift register for serial access, therefore the input and output operations cannot be simultaneously done. Therefore it is not suitable for effective use of the image memory.

SUMMARY OF THE INVENTION

An object of the present invention is to provide an image memory capable of simultaneously carrying out serial input and output operations and having random access function.

Another object of the present invention is to provide an image memory in which the serial read function and the random access function can be simultaneously used.

Briefly stated, the present invention comprises a plurality of memory devices; a plurality of registers for writing each connected to a data input portion of each of the memory devices; a plurality of registers for reading each connected to a data output portion of each of the memory devices; a random access bus connected to the registers for writing and registers for reading; a serial access bus connected to the registers for writing and registers for reading; and a control circuit controlling the memory devices, registers for writing and registers for reading. The control circuit freely selects random write control, in which data inputted from the random access bus to registers for writing is written only in a selected memory device, random read control in which the data in the memory devices are inputted to registers for reading and only the selected data as outputted to the random access bus; serial write control in which the serial data from the serial access bus are held as parallel data by the registers for writing and are simultaneously written in each of the memory devices; and serial read control in which the parallel data simultaneously read from each of the memory devices are held in the registers for reading and serially outputted to the serial access bus.

According to another aspect of the present invention, a plurality of second registers for reading are provided besides the above described plurality of registers for reading (referred to as first registers for reading). Each of the second registers for reading is connected to the data output portion of each memory device and to the random access bus. A control circuit controls memory devices, registers for writing and first and second registers for reading, whereby it freely selects random write control, in which data inputted from the random access bus to the registers for writing is written only in the selected memory device; random read control in which data of the memory devices are inputted to the second registers for reading and only the selected data is outputted to the random access bus; serial write control in which the serial data from the serial access bus are held as parallel data in registers for writing and are simultaneously written in the memory devices; serial read control in which parallel data simultaneously read from the memory devices are held in first registers for reading and serially outputted to the serial access bus; first mixed control in which the serial read control and the random write control are mixed; and second mixed control in which the serial read control and the random read control, in which the data from memory devices are inputted to the second registers for reading and only the selected data is outputted to the random access bus, are mixed.

According to the present invention, the serial input and output can be simultaneously carried out, so that the input and output can be carried out effectively at high speed. In addition, random access, which could be done only by the block unit in a conventional field image memory, becomes possible, enabling image processing which cannot be effected sequencely.

According to another aspect of the present invention, two systems of registers for reading are provided, whereby the serial reading operation can be mixed with random access operation.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
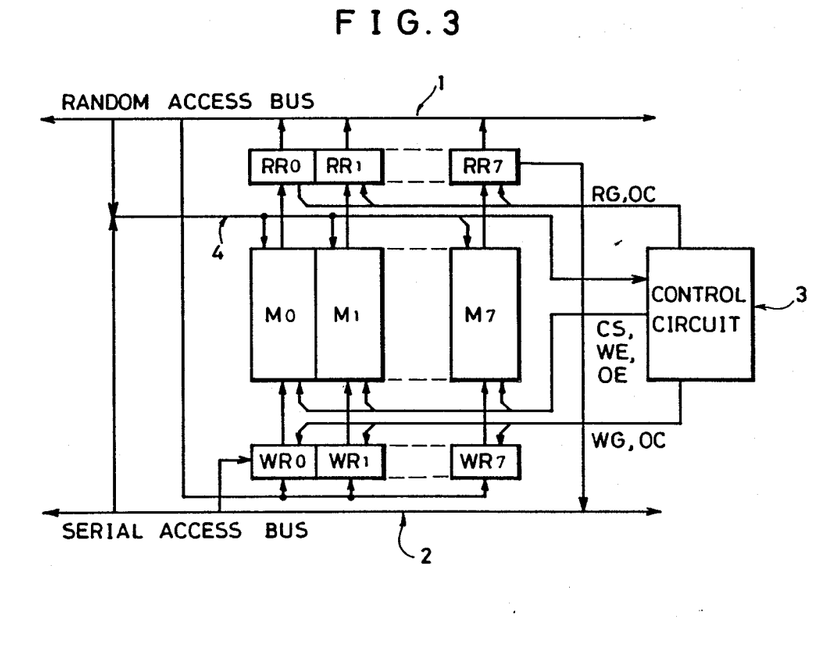
FIG. 3 is a block diagram showing a schematic structure of an image memory in accordance with one embodiment of the present invention.

As shown in FIG. 3, an image memory in accordance with one embodiment of the present invention comprises a plurality of memory devices M0 to M7; a plurality of registers WR0 to WR7 for writing each connected to a data input portion of each of the memory devices M0 to M7; a plurality of registers RR0 to RR7 for reading each connected to a data output portion of each of the memory devices M0 to M7; a random access bus 1 connected to the registers WR0 to WR7 for writing and to registers RR0 to RR7 for reading; a serial access bus 2 connected to the registers WR0 to WR7 for writing and to the registers RR0 to RR7 for reading; and a control circuit 3 controlling memory devices M0 to M7, registers WR0 to WR7 for writing and registers RR0 to RR7 for reading. The random access bus 1 and the serial access bus 2 respectively comprise both an image data bus and an address bus. Registers WR0 to WR7 for writing are registers for holding write data from the buses 1 and 2, and consist of a transparent type latch (for example, 74LS573). The registers RR0 to RR7 for reading are registers for holding data red from the memory devices M0 to M7, and each consists of a transparent type latch as in the case of the registers WR0 to WR7 for writing. The transparent type latch (register) latches, when a gate signal G is at the "low" level, input data at the fall of the gate signal G and passes the input data directly when the gate signal G is at the "high" level. In the present embodiment, the former latching function is utilized in serial accessing while the latter mentioned transparent function is utilized in random accessing. An output control signal OC freely switches an output state and a non-output state of the register.

The number of the memory devices M0 to M7, registers WR0 to WR7 for writing and of the registers RR0 to RR7 for reading should be in correspondence with the number of data simultaneously accessed in serial accessing. In this embodiment, eight memory devices, eight registers for writing and eight registers for reading are used for simultaneously processing image data of 8 pixels transferred sequentially.

The control circuit 3 outputs a chip select signal CS, write enable signal WE and an output enable signal OE of the memory devices M0 to M7. It also outputs a gate signal WG for the registers WR0 to WR7 for writing, a gate signal RG for the registers RR0 to RR7 for reading and output control signal OC. Accordingly, the control circuit 3 freely selects the random write control in which only the data selected from those inputted from the random access bus 1 to the registers WR0 to WR7 for writing is written in the memory devices M0 to M7; random read control in which data from the memory devices M0 to M7 are inputted to the registers RR0 to RR7 for reading and only the selected data is outputted to the random access bus 2; serial write control in which serial data from the serial access bus 2 are held as parallel data in the register WR0 to WR7 for writing and simultaneously written in the memory devices M0 to M7; and serial read control in which parallel data simultaneously read from the memory devices M0 to M7 are held in the registers RR0 to RR7 for reading and serially outputted to the serial access bus 2. An address bus 4 applies address to each of the memory devices M0 to M7. One line may be used both as the random access bus 1 and the serial access bus 2. In that case, an external circuit (not shown) which has access to the image memory determines which of the data and address for random access and those for serial access should be applied to the image memory.

Figure 4:
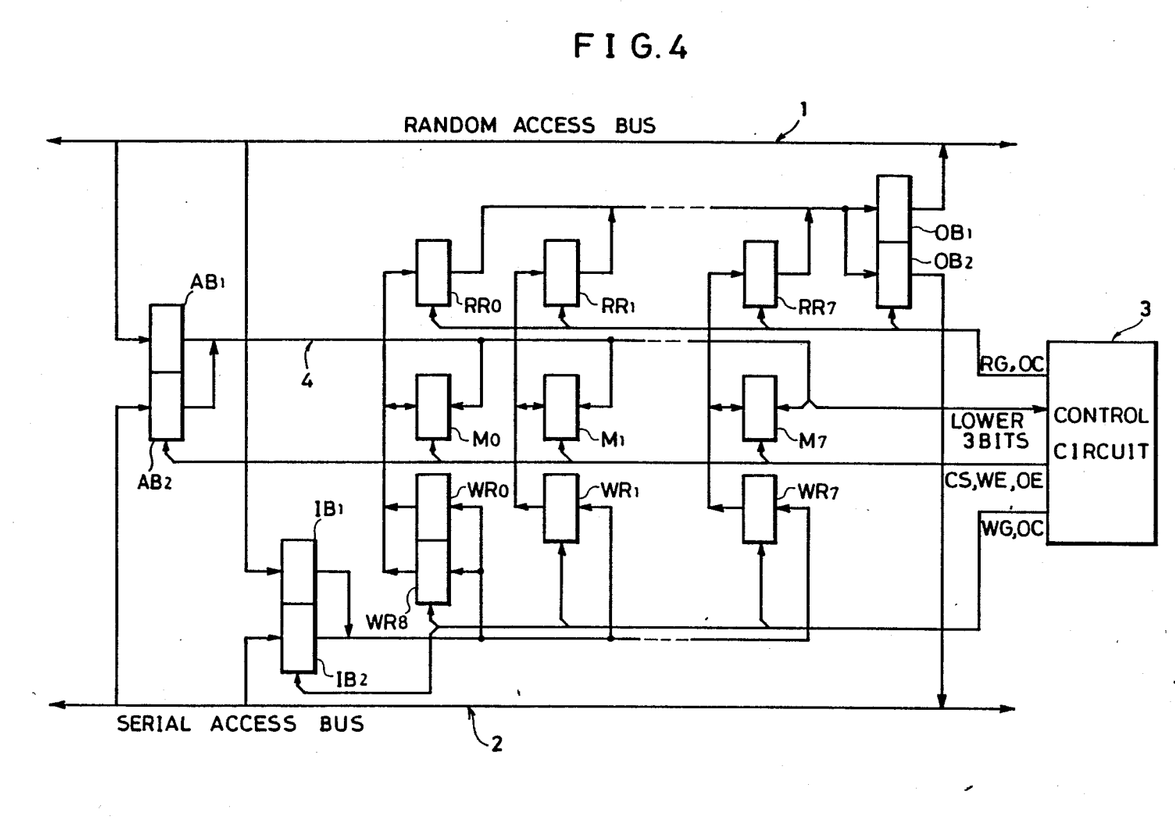
FIG. 4 is a more detailed block diagram of FIG. 3.

FIG. 4 is a more detailed block diagram of the circuit shown in FIG. 3. Address buffers AB1 and AB2 consisting of tristate buffers selectively input addresses from the random access bus 1 and from the serial access bus 2 to the address bus 4. Input buffers IB1 and IB2 consisting of tristate buffers select write data from the two buses 1 and 2. Output buffers OB1 and OB2 consisting of tristate buffers determine whether the read data from the memory devices M0 to M7 should be outputted to the bus 1 or to the bus 2. A register WR8 for writing and the register WR0 for writing are used alternately.

In the above described embodiment shown in FIGS. 3 and 4, registers WR0 to WR7 for writing are connected to input portions of respective memory devices M0 to M7 and registers RR0 to RR7 for reading are connected to output portions of the respective memory devices M0 to M7 and the random access bus 1 and the serial access bus 2 are respectively connected to both the registers WR0 to WR7 and RR0 to RR7. Therefore, random access can be carried out by setting one of the registers at an output state, and the data input/output by serial accessing can be carried out by serial/parallel conversion in each of the registers.

More specifically, random access writing operation can be carried out by setting only a selected register WRi (i=0 to 7) for writing at the output state and by applying a write signal only to a memory device Mi corresponding to the selected register. Meanwhile, random access reading operation can be carried out by setting only a selected one memory device Mi at a read state and by setting a register RRi for reading corresponding thereto at the output state.

Figure 1B:
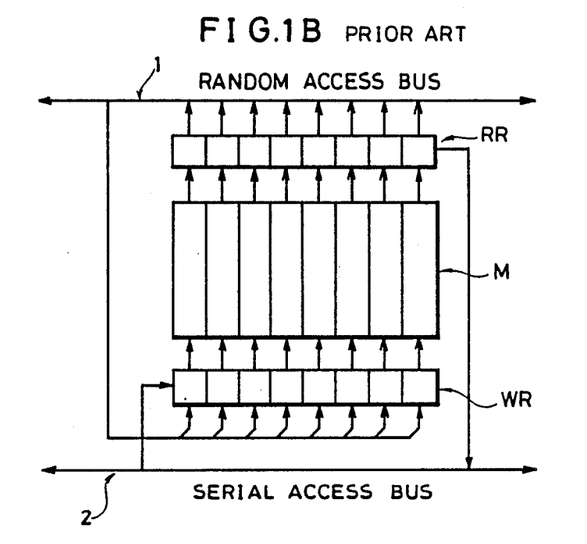
FIG. 1B is a block diagram illustrating the principle of one embodiment of the present invention.

The serial writing operation can be carried out by latching data one by one from the serial access bus 2 to the registers WR0 to WR7 for writing and when a prescribed number of data are stored, by simultaneously writing the same to the memory devices M0 to M7. The serial reading operation can be carried out by temporarily latching data simultaneously read from each of the memory devices M0 to M7 in the registers RR0 to RR7 for reading and by outputting the data one by one successively to the serialaccess bus 2. On this occasion, the registers WR for writing and the registers RR for reading can be independently used as shown in FIG. 1B, whereby the serial data input to the image memory and the serial data output from the image memory can be simultaneously carried out. The data selecting register for random access is also used as the serial-parallel converting register for serial access as shown in the same figure, each register can be used both in random accessing and serial accessing, and therefore the circuit structure is relatively simple though it has many functions.

The operation of the above described embodiment in the random access mode and in the serial access mode will be described in the following.

(i) Random Access Mode (1) Writing Operation

Write data sent from the random access bus 1 are applied to the registers WR0 to WR7 for writing by enabling the input buffer IB1 and disabling the input buffer IB2. In the random access mode, registers WR0 to WR7 for writing are all set in the transparent state and output state, whereby the input data are directly outputted. Accordingly, the same write data are equally inputted to the memory devices M0 to M7. Meanwhile, write addresses sent from the random access bus 1 are equally inputted to eight memory devices M0 to M7 by enabling the address buffer AB1 and disabling the address buffer AB2. On this occasion, specified (n−3) bits (normally, higher order (n−3) bits) are inputted to the memory device M0 to M7 as addresses and the remaining 3 bits (lower order 3 bits) are inputted to the control circuit 3. The control circuit 3 decodes the lower order 3 bits of the address to select one of the memory devices M0 to M7, and transmits a chip select signal CS and a write enable signal WE only to that memory device. By doing so, the write data is written only in one memory device. Not all of the registers WR0 to WR7 for writing need be made transparent. Only the register corresponding to the memory device to which the data is written may be made transparent.

(2) Reading Operation

Similar to the writing operation, the higher order (n−3) bits of the read address sent from the random access bus 1 are equally inputted to all of the memory devices M0 to M7 through the address buffer AB1 and the address bus 4. The lower order 3 bits of the read address are inputted to the control circuit 3, which are decoded to select one memory device, and the control circuit 3 applies a chip select signal CS and an output enable signal OE only to that memory device. One of the registers RR0 to RR7 for reading is set at the transparent state and output state by a signal obtained from decoding the lower order 3 bits of the address, whereby the read data outputted from the memory device are directly outputted. The read data are outputted to the random access bus 1 through the output buffer OB1.

On this occasion, even if all of the memory device M0 to M7 are brought into the reading state, there will be no problem since only one of the registers RR0 to RR7 for reading is set at the output state.

As described above, random access can be carried out by selecting one memory device using a signal obtained from decoding the lower order 3 bits of the address and by setting transparent only the register corresponding thereto.

(ii) Serial Access Mode

Figure 5:
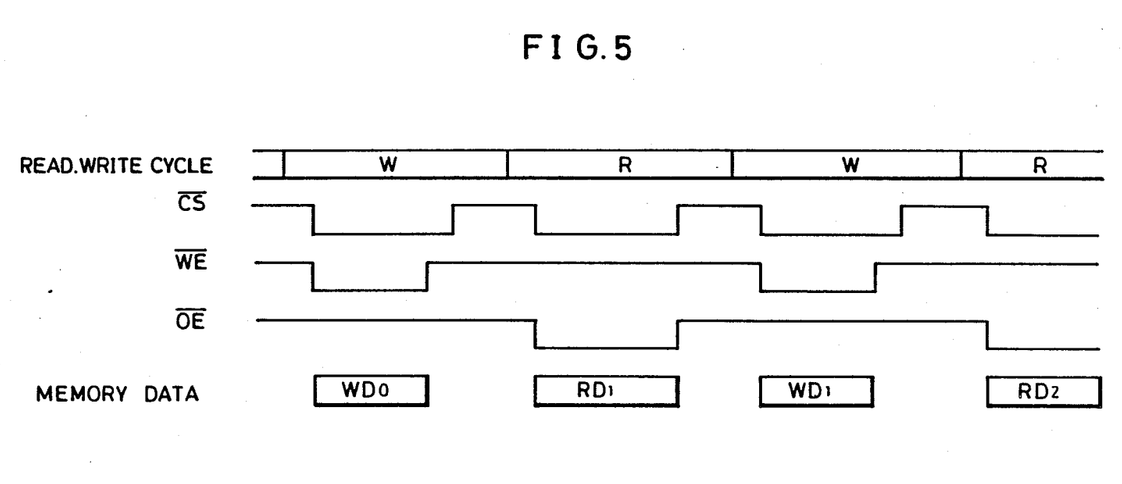
FIGS. 5 to 7 are timing charts for explaining operation of the embodiment shown in FIGS. 3 and 4.

FIG. 5 is a timing chart showing the operation timing in the serial access mode. In the serial access mode, the memory devices M0 to M7 are controlled separately in the read cycle R and the write cycle W for carrying out the reading operation and the writing operation independently from each other. Each of the memory devices M0 to M7 carries out writing or reading operation in response to a chip select signal CS, write enable signal WE and an output enable signal OE applied from the control circuit 3 at a prescribed timing. The registers WR0 to WR7 for writing latch serial data for 8 pixels sent from the serial access bus 2 while the memory devices M0 to M7 are not in the writing state and prepare for writing into the memory devices M0 to M7 in the next write cycle. The registers RR0 to RR7 for reading sequentially output, while the memory devices M0 to M7 are not in the reading state, read data from 8 memory devices M0 to M7 which have been latched therein. The writing operation and the reading operation will be separately described in the following.

(1) Writing Operation

Figure 6:
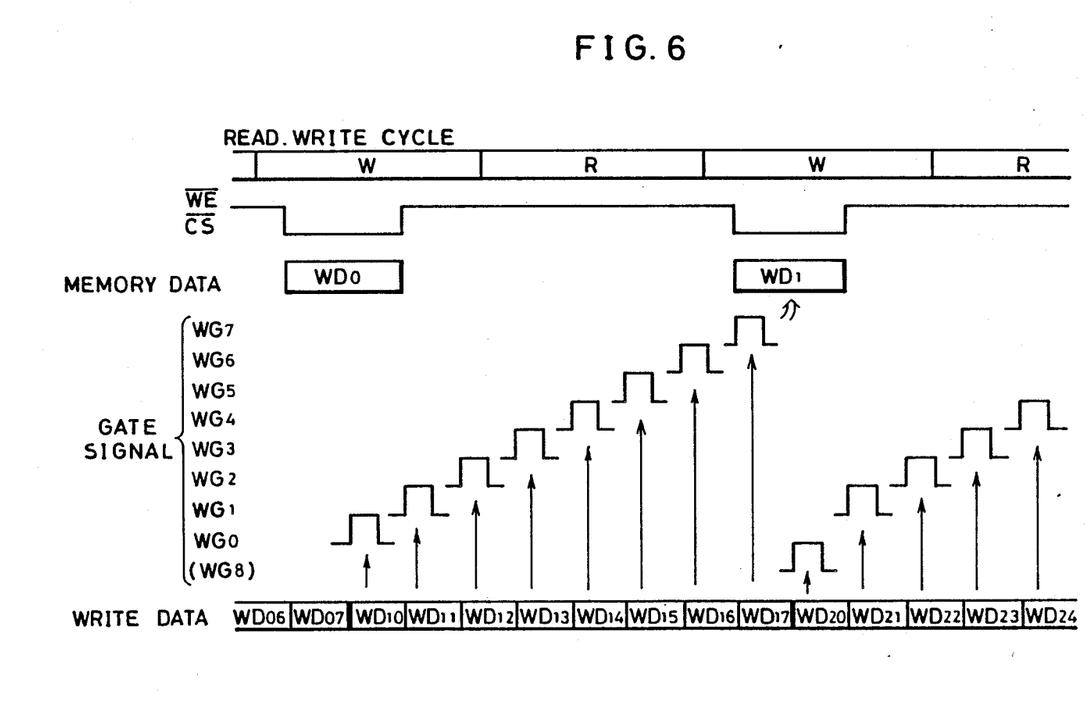

FIG. 6 is a timing chart showing the timing of the writing operation in the serial access mode. The writing operation in the serial access mode will be described with reference to FIGS. 4 and 6. Write addresses are inputted from the serial access bus 2 to the address buffer AB2 to the memory devices M0 to M7 in the write cycle. Write data WD00 to WD07, WD10 to WD17, WD20 to WD27, . . . sent from the serial access bus 2 with a prescribed cycle are applied to the registers WR0 to WR7 for writing through the input buffer IB2. Gate signals WG0 to WG7 for writing generated in the control circuit 3 in synchronization with each of the write data as shown in FIG. 6 are successively applied to the registers WR0 to WR7 for writing, and the registers for writing latch the write data one by one in order. The registers WR0 to WR7 for writing consisting of transparent type latches latch the write data at the fall of the gate signals W00 to WG7, and therefore the gate signals WG0 to WG7 must fall when the respective write data are stable. An output control signal OC is applied to the registers WR0 to WR7 for writing so that the latched data are constantly outputted, and when 8 data are provided, the control circuit 3 applies the same chip select signal C and the write enable signal WE to 8 memory devices M0 to M7. Consequently, the data for 8 pixels are simultaneously written in 8 memory devices M0 to M7. In order to do so, the write data, the gate signals WG0 to WG7 of the registers WR0 to WR7 for writing and the read, write cycle must be in synchronization with each other at a prescribed timing so that 8 write data are gathered when the write cycle comes. After the registers WR0 to WR7 for writing wrote data in the memory devices M0 to M7, the registers are updated with new write data successively in preparation of the next write cycle. Since the access time of the memory devices M0 to M7 is longer than the cycle of the write data transfer as shown in FIG. 6, the contents of the registers WR0 to WR7 for writing are newly updated while the write data are written in the memory devices M0 to M7. Therefore, there is a possibility that the write data of the next cycle are accidentally written in the memory devices M0 to M7. In order to prevent this error, registers WR0 to WR8 for writing are switched at every write cycle so as to be operated alternately.

(2) Reading Operation

Figure 7:
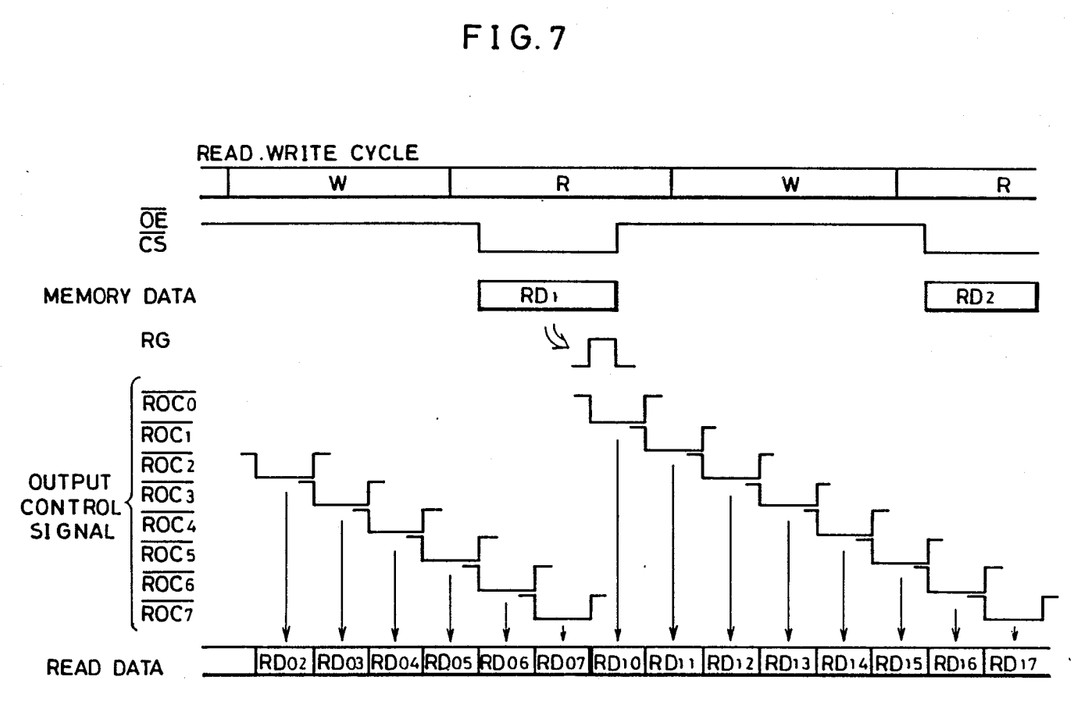

FIG. 7 is a timing chart showing the timing of the reading operation in the serial access mode. The reading operation in the serial access mode will be described with reference to FIGS. 4 and 7. In the read cycle, the memory devices M0 to M7 receive read addresses from the serial access bus 2 through the address buffer AB2. On this occasion, the control circuit 3 applies the chip select signal CS and the output enable signal OE to all of the memory devices M0 to M7 and the memory devices M0 to M7 simultaneously output various memory data RD1. At this time, the registers RR0 to RR7 for reading receive a gate signal RG for latching the read data from the control circuit 3 and latch these read data simultaneously. Output control signals ROC0 to ROC7 generated from the control circuit 3 are successively applied to the registers RR0 to RR7 for reading which are brought to the output state one by one successively to output the read data RD10 to RD17 one by one in this order. The successively outputted read date RD10 to D17 are outputted to the serial access bus 2 through the output buffer OB2 as serial data. After outputting data for 1 cycle, the registers RR0 to RR7 for reading latch new memory data RD2 of 8 pixels for the next read cycle.

As described above, the serial data are successively stored in the registers WR0 to WR7 for writing and they are simultaneously written in each of the memory devices M0 to M7, while memory data from respective memory devices M0 to M7 are simultaneously read out to the registers RR0 to RR7 for reading and they are successively read. In this manner, the reading and writing operation of the serial data can be carried out.

Figure 8:
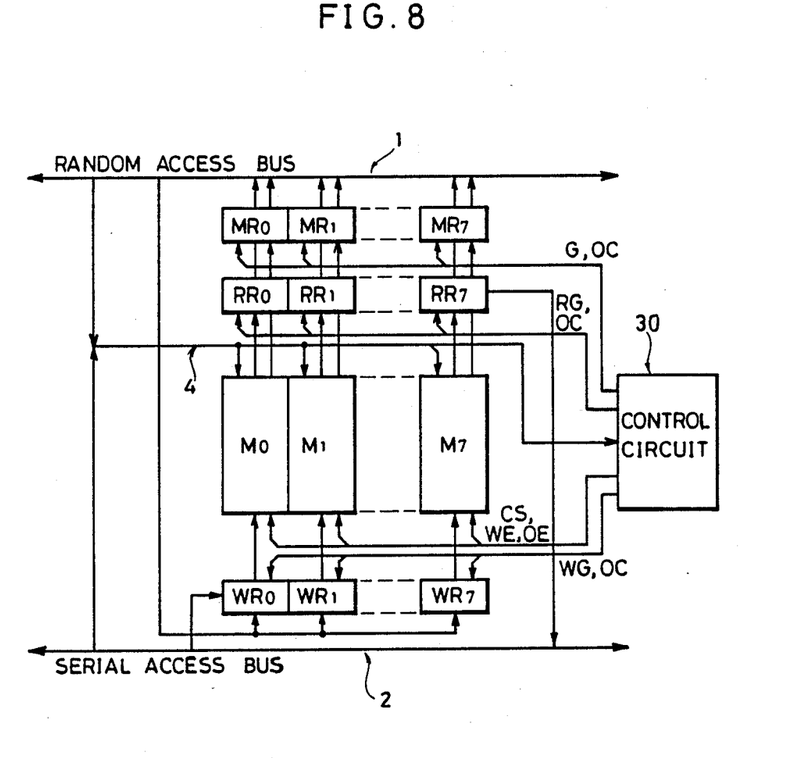
FIG. 8 is a block diagram showing a schematic structure of an image memory in accordance with another embodiment of the present invention.

Referring to FIG. 8, another embodiment of the present invention comprises a plurality of memory devices M0 to M7, a plurality of registers WR0 to WR7 for writing each connected to a data input portion of each of the memory devices M0 to M7; a plurality of registers RR0 to RR7 for reading each connected to a data output portion of each of the memory devices M0 to M7; a plurality of registers MR0 to MR7 exclusively for random reading each connected to the data output portion of each of the memory devices M0 to M7; a random access bus 1 connected to the registers WR0 to R7 for writing, registers RR0 to RR7 for reading and to the registers MR0 to MR7 exclusively for random reading; a serial access bus connected to the registers WR0 to WR7 for writing and to the registers RR0 to RR7 for reading; and a control circuit 30 controlling the memory devices M0 to M7, registers WR0 to WR7 for writing, registers RR0 to RR7 for reading and the registers MR0 to MR7 for random reading.

More specifically, in the embodiment shown in FIG. 8, the registers MR0 to MR7 for random reading are added to the structure of the embodiment shown in FIG. 3. The registers MR0 to MR7 used only for random reading are formed of transparent type latches and the output control signal OC from the control circuit 3 freely switches between the output state and the non-output state thereof, as in the case of the registers WR0 to WR7 for writing and the registers RR0 to RR7 for reading.

The control circuit 30 freely selects random write control in which only the data selected from the data inputted to the registers WR0 to WR7 for writing from the random access bus 1 is written in the memory devices M0 to M7; random read control in which data from the memory devices M0 to M7 are inputted to the registers MR0 to MR7 used exclusively for random reading and only the selected data is outputted to the random access bus 1; serial write control in which the serial data from the serial access bus 2 are held as parallel data in the registers WR0 to WR7 for writing and they are simultaneously written in the memory devices M0 to M7; serial read control in which parallel data read simultaneously from each of the memory devices M0 to M7 are held in the registers RR0 to RR7 for reading and are serially outputted to the serial access bus 2; first mixed control in which the serial read control and the random write control are mixed; and second mixed control in which the serial read control is mixed with random read control in which the data from the memory devices M0 to M7 are inputted to the registers MR0 to MR7 used exclusively for random reading an only the selected data is outputted to the random access bus 1.

Figure 9:
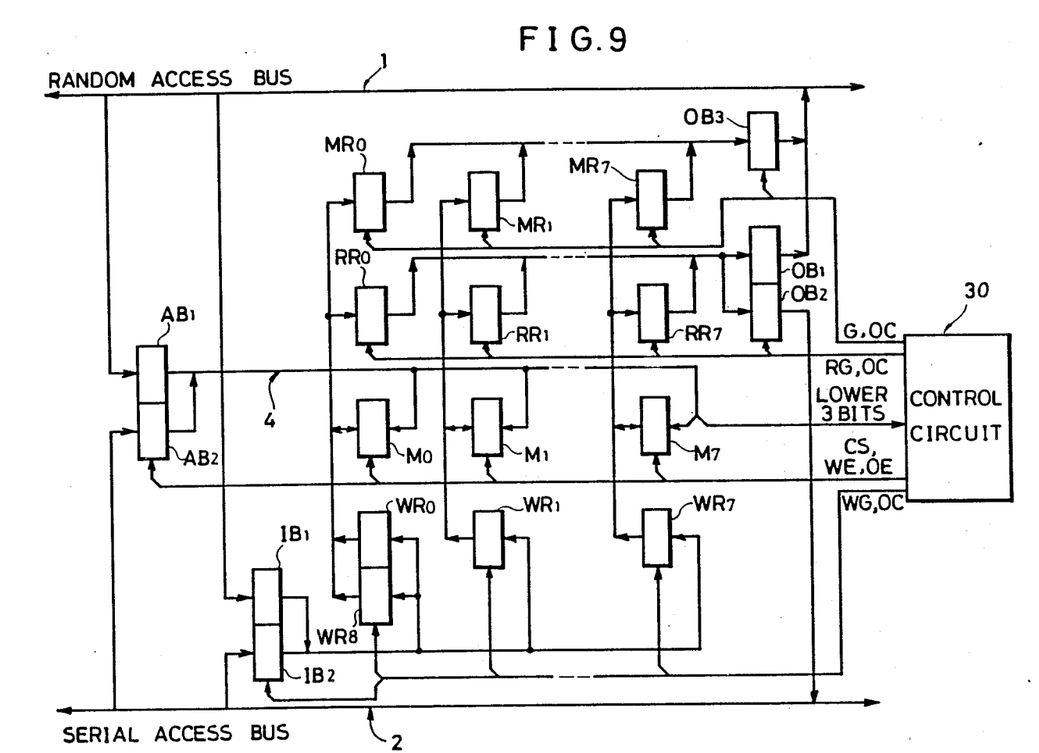
FIG. 9 is a more detailed block diagram of the circuit shown in FIG. 8.

FIG. 9 is a more detailed block diagram of the circuit shown in FIG. 8. Meanwhile, descriptions of the structure in FIG. 9 having the same function as that of FIG. 4 will be omitted. Referring to the figure, the output buffer OB3 consisting of a tristate buffer determines whether the read data from the registers MR0 to MR7 for random reading should be outputted to the bus 1 or 2.

In the above described embodiment shown in FIGS. 8 and 9, registers WR0 to WR7 for writing are connected to the input portions of the respective memory devices M0 to M7, two systems of registers RR0 to RR7 and MR0 to MR7 for reading are connected to the output portions of the respective memory devices M0 to M7, and the random access bus 1 and the serial access bus 2 are respectively connected to both the registers RR0 to RR7 and WR0 to WR7. Accordingly, random accessing can be carried out by setting any one of the registers WR0 to WR7 or RR0 to RR7 at the output state. Serial access data input and output can be effected by carrying out serial/parallel conversion in each of the registers. In addition, since two systems of registers RR0 to R7 and MR0 to MR7 for reading are provided, the serial reading operation and the random reading operation can be simultaneously carried out, and the serial reading operation and random access operation can be simultaneously carried out.

More specifically, by setting only one selected register WRi (i=0 to 7) for writing at the output state and by applying a write signal only to the memory device Mi corresponding to this register, the random access writing operation can be carried out. By setting only the selected one memory device Mi at the read state and by setting only the corresponding register RRi for reading at the output state, the random access reading operation can be carried out.

Figure 2B:
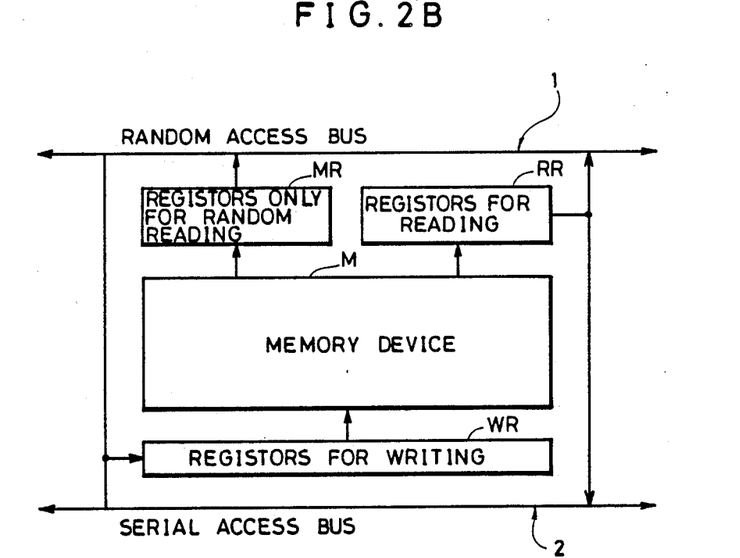
FIG. 2B is a block diagram illustrating the principle of another embodiment of the present invention.

By latching the data one by one successively from the serial access bus 2 to the registers WR0 to WR7 for writing and by simultaneously writing the data into the memory devices M0 to M7 when a prescribed number of data are stored, the serial writing operation can be carried out. By temporarily latching the data simultaneously read from each of the memory devices M0 to M7 at the registers RR0 to RR7 for reading and by outputting the data one by one successively to the serial access bus 2, the serial reading operation can be carried out. On this occasion, the registers WR for writing and the registers RR for reading can be independently used as shown in FIG. 2B, so that the serial data input to the image memory and the serial data output from the image memory can be simultaneously carried out.

In addition, since there are two systems of registers RR and MR for reading, the serial reading and random reading can be simultaneously effected by using the register RR for serial read operation and using the register MR for random reading. The serial reading and random writing can be simultaneously effected by using the registers RR for reading and he registers WR for writing, respectively. Therefore, the serial reading operation and the random access operation can be simultaneously carried out.

The operation of the embodiment shown in FIGS. 8 and 9 will be described in the following. The operation of this embodiment comprises the random access mode, serial access mode and mix mode in which the serial reading and random access are simultaneously carried out. Since the operations in the random access mode and the serial access mode are the same as the embodiment shown in FIGS. 3 and 4, only the mix mode operation will be described in the following.

Figure 10:
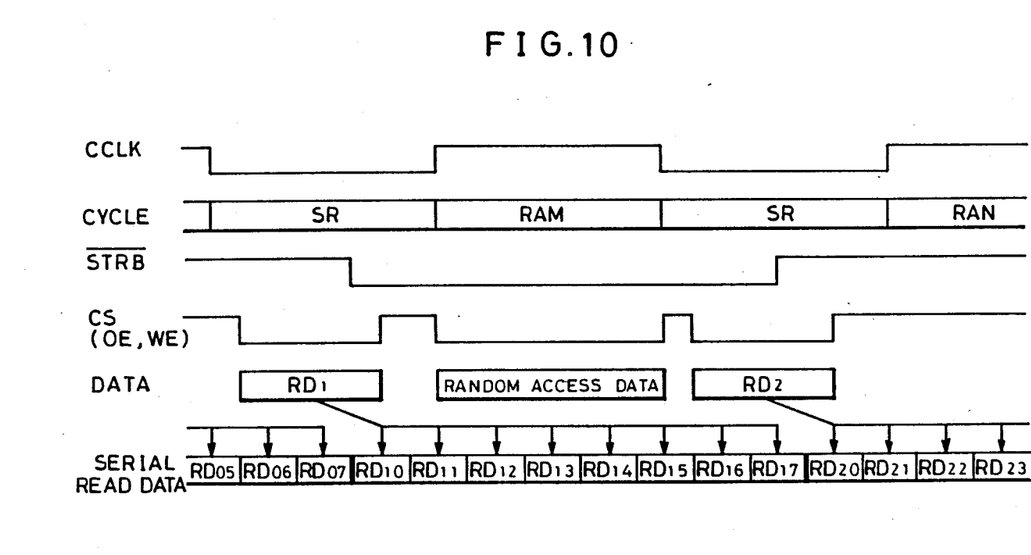
FIG. 10 is a timing chart for explaining the mix mode operation in the embodiment shown in FIGS. 8 and 9.

FIG. 10 is a timing chart showing the operation timing in the mix mode. In the figure, the reference numeral SR denotes a serial read cycle, and RAN denotes a random access cycle for random writing or random reading. In the mix mode, the write cycle in the serial access mode is allotted for random access cycle, whereby the serial reading operation and the random access operation are simultaneously carried out.

The operation in the mix mode will be described in the following with reference to FIG. 10.

(1) Serial Read Random Write Operation

The operation of each of the circuits for serial reading in the serial read cycle SR is the same as the reading operation in the serial access mode which is described above. However, the registers WR0 to WR7 for writing are not activated in the serial read cycle SR.

The memory access for serial reading is terminated in the serial read cycle SR, and therefore in the random access cycle RAN, the writing operation in the random access mode can be effected in the same manner as described above.

(2) Serial Read Random Read operation

In serial reading, the registers RR0 to RR7 for reading are always occupied for serial read operation. Therefore, the data read at random read operation cannot be outputted through the registers RR0 to RR7 for reading. Accordingly, the registers MR0 to MR7 are used for the random reading. When one memory device Mi (i=0 to 7) selected by the lower order 3 bits of the address is accessed in the random access cycle RAN, the data read from the memory device Mi is once latched in the register MRi for random reading corresponding to the memory device. Thereafter, only the registers MRi latching the random read data is brought to the output state, whereby the random read data is outputted from the register MRi. (The following manners may be available, namely: Data are read from 8 memory devices M0 to M7, the data is latched only in selected one register MRi and only that register MRi is brought to the output state; or data are read from 8 memory devices M0 to M7 and the data are latched in respective registers MR0 to MR7 corresponding to the memory devices and only the selected register MRi is brought to the output state.) In the random read mode, the output buffer OB1 is always disabled and the output buffer OB3 is always enable,, and the random read data are outputted to the random access bus 1 through the output buffer OB3.

A circuit for generating the chip select signal CS applied to the memory devices M0 to M7 in respective modes will be hereinafter described with reference to FIG. 11.

Figure 11:
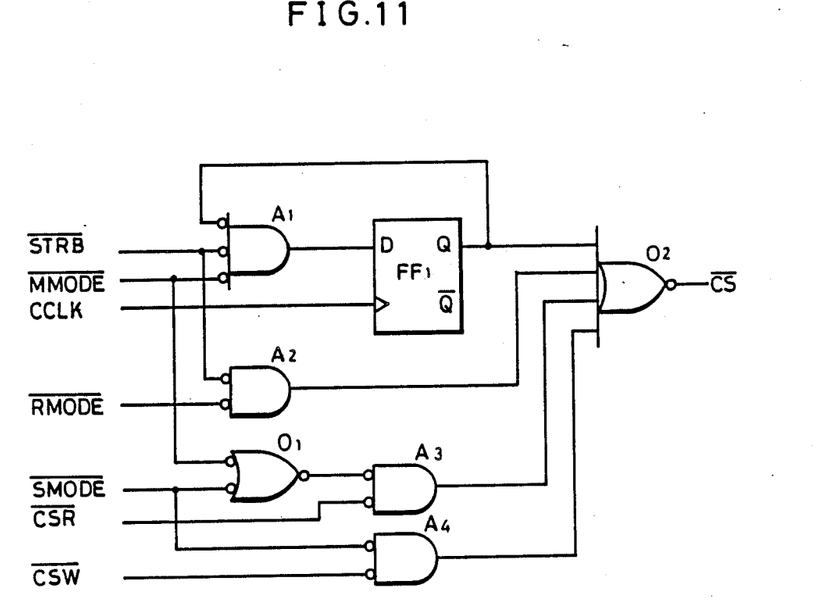
FIG. 11 is a circuit diagram of a chip select signal generating circuit employed in the embodiment shown in FIGS. 8 and 9.

In FIG. 11, $\overline{STRB}$ is a strobe signal which becomes active (low level) when the image memory is accessed from outside. $\overline{MMODE}$ is a mix mode signal which becomes active (low level) in the mix mode. CCLK is a cycle clock signal for distinguishing the serial read cycle SR from the random access cycle RAN, which becomes "low" level in the serial read cycle SR and becomes "high" level in the random access cycle RAN. $\overline{RMODE}$ is a random access mode signal which becomes active (low level) in the random access mode. $\overline{SMODE}$ is a serial access mode which becomes active (low level) in the serial access mode. $\overline{CSR}$ is a chip select signal for serial reading which becomes active (low level) in reading. $\overline{CSW}$ is a chip select signal for serial writing which becomes active (low level) in writing.

The strobe signal $\overline{STRB}$ and the mix mode signal $\overline{MMODE}$ are inputted to an AND circuit A1. The output of the AND circuit A1 is connected to a data input D of a flip-flop FF1 with the Q output of the flip-flop FF1 being fed back to the input of the AND circuit A1. The cycle clock signal CCLK is inputted to a clock terminal of the flip-flop FF1. The strobe signal $\overline{STRB}$ and the random access mode signal $\overline{RMODE}$ are inputted to the AND circuit A2. The mix mode signal $\overline{MMODE}$ and the serial access mode signal $\overline{SMODE}$ are inputted to an OR circuit 01. The output of the OR circuit 01 and the chip select signal $\overline{CSR}$ for serial reading are inputted to an AND circuit A3. The serial access mode signal $\overline{SMODE}$ and the chip select signal $\overline{CSW}$ for serial writing are inputted to an AND circuit A4. The Q output of the flip-flop FF1 and outputs from the AND circuits A2 to A4 are inputted to an OR circuit O2, and the chip select signal $\overline{CS}$ is provided from the output of the OR circuit O2.

The operation of the above circuit in respective modes will be described in the following.

(I) In the random access mode (when $\overline{RMODE}$ is active), when the image memory is accessed at random ($\overline{STRB}$ becomes active), the output of the AND circuit A2 becomes "high" level and the chip select signal $\overline{CS}$ becomes active through the OR circuit O2.

(II) In the serial access mode ($\overline{SMODE}$ is active), the chip select signal $\overline{CSR}$ for serial reading or the chip select signal $\overline{CSW}$ for serial writing is outputted as the chip select signal $\overline{CS}$ through the AND circuits A3 and A4 and through the OR circuit O2.

(III) In mix mode ($\overline{\text{MMODE}}$ is active), when the image memory is not externally accessed ($\overline{\text{STRB}}$ is not active), the output of the AND circuit A1 becomes "low" level. Since the flip-flop FF1 latches the output of the AND circuit A1 in synchronization with the edge of the cycle clock signal CCLK, the output thereof also becomes "low" level. Although the Q output of the flip-flop FF1 is fed back to the AND circuit A1, the strobe signal $\overline{\text{STRB}}$ is not active, and therefore the output of the AND circuit A1 is fixed at the "low" level until there is a random access. In the mix mode, the output of the OR circuit O1 becomes "low" level, so that the chip select signal for serial reading is outputted from the AND circuit A3. As a result, only the chip select signal $\overline{\text{CSR}}$ for serial reading is transmitted from the OR circuit O2.

When there is a request for a random access ($\overline{\text{STRB}}$ becomes active) in the serial read cycle as shown in FIG. 10 in this mix mode, the output of the AND circuit A1 becomes "high" level. However, the output of the flip-flop FF1 waits at the "low" level for the rising edge of the next cycle clock signal CCLK. More specifically, if random access is requested during the serial read cycle, the access will be kept waiting until the start of the next random access cycle. When a new random access cycle is started, the flip-flop FF1 latches the "high" level output of the AND circuit A1, the Q output of the flip-flop FF1 becomes "high" level and the chip select signal $\overline{\text{CS}}$ becomes active through the OR circuit O2. Meanwhile, since the Q output of the flip-flop FF1 has been fed back to the AND circuit A1, the output of the AND circuit A1 immediately becomes "low" level. At the start of the next serial read cycle, the flip-flop FF1 latches the "low" level output of the AND circuit A1 in synchronization with the falling edge of the cycle clock signal CCLK even if there is still a request for accessing, thereby rendering inactive the chip select signal $\overline{\text{CS}}$. By providing a flip-flop FF1 and feeding back the Q output to the AND circuit A1, the random access is permitted only in the random access cycle, and the access is terminated without fail in one random access cycle.

The chip select signal generating circuit is a component of the control circuit 3. In the control circuit 3, a memory device is selected by lower order 3 bits of the address and a chip select signal $\overline{\text{CS}}$ generated from the chip select signal generating circuit is applied to that memory device, while a write enable signal WE generated at the same timing as the chip select signal $\overline{\text{CS}}$ is applied in writing and an output enable signal $\overline{\text{OE}}$ also generated at the same timing as the chip select signal $\overline{\text{CS}}$ is applied in reading simultaneously to the memory device thereby controlling the reading and writing operation of the memory device.

It goes without saying that the whole circuit of the above described embodiment may be integrated in 1 chip.

Although the present invention has been described and illustrated in detail, it is clearly understood that the same is by way of illustration and example only and is not to be taken by way of limitation, the spirit and scope of the present invention being limited only b the terms of the appended claims.

What is claimed is:
1. An image memory comprising:
   a plurality of memory devices;
   a plurality of registers for writing each connected to a data input portion of each of said memory devices;
   a plurality of registers for reading each connected to a data output portion of each of said memory devices;
   a random access bus connected to said registers for writing and registers for reading;
   a serial access bus connected to said registers for writing and said registers for reading; and
   a control circuit controlling said memory devices, said registers for writing and said registers for reading, thereby freely selecting,
   random write control in which data inputted from said random access bus to said registers for writing is written only in a memory device selected from said memory devices,
   random read control in which data of said memory devices are inputted to said registers for reading and only a selected data is outputted to said random access bus,
   serial write control in which serial data from said serial access bus are held in said registers for writing as parallel data and are simultaneously written in respective said memory devices, and
   serial read control in which parallel data simultaneously read from said respective memory devices are held in said registers for reading and serially outputted to said serial access bus.

2. An image memory according to claim 1, wherein said register for writing and said register for reading are formed of transparent type latches.

3. An image memory according to claim 1, wherein said control circuit is adapted for simultaneously selecting said serial write control and said serial read control.

4. An image memory comprising:
   a plurality of registers for writing each connected to a data input portion of each of said memory devices;
   a plurality of first registers for reading each connected to a data output portion of each of said memory devices;
   a plurality of second registers for reading each connected to a data output portion of each of said memory devices;
   a random access bus connected to said registers for writing and said first and second registers for reading;
   a serial access bus connected to said registers for writing and said first registers for reading; and
   a control circuit controlling said memory devices, said registers for writing and said first and second registers for reading, thereby freely selecting
   random write control in which said memory devices, said registers for writing and said first and second registers for reading are controlled and whereby data inputted from said random access bus to said registers for writing are written only in a memory device selected from said memory devices,
   random read control in which data from said memory devices are inputted to at least one of said first and second registers for reading and only a selected data is outputted to said random access bus,
   serial write control in which serial data from said serial access bus are held as parallel data in said registers for writing and simultaneously written in respective said memory devices, serial read control in which parallel data simultaneously read from said respective memory devices are held in said first registers for reading and serially outputted to the serial access bus, first mixed control in which said serial read control is mixed with said random write control, and second mixed control in which said serial read control is mixed with random read control in which data from said memory devices are inputted to said second registers for reading and only a selected data is outputted to said random access bus.

5. An image memory according to claim 4, wherein said register for writing and said first register for reading are formed of transparent type latches.

6. An image memory according to claim 4, wherein said control circuit is adapted for simultaneously selecting said serial write control and serial read control.

* * * * *